United States Patent [19]

Thornton et al.

[11] Patent Number: 4,491,295
[45] Date of Patent: Jan. 1, 1985

[54] GANG CUTTING TOOL ASSEMBLY AND METHOD OF FORMING SAME

[75] Inventors: Henry M. Thornton; John S. Thornton, both of York, Pa.

[73] Assignee: Ashcombe Products Company, Dover, Pa.

[21] Appl. No.: 487,464

[22] Filed: Apr. 22, 1983

Related U.S. Application Data

[62] Division of Ser. No. 231,341, Feb. 4, 1981, abandoned.

[51] Int. Cl.³ .............................................. B29C 11/00
[52] U.S. Cl. .................................. 249/53 R; 249/83; 249/142; 249/177
[58] Field of Search .................. 249/53 R, 83, 91, 142, 249/177

[56] References Cited

U.S. PATENT DOCUMENTS

| | | | |
|---|---|---|---|
| 3,108,329 | 10/1963 | Chapman | 249/91 |
| 3,171,175 | 3/1965 | Curcio | 249/83 |
| 3,290,421 | 12/1966 | Miller, Jr. | 249/91 |
| 3,680,825 | 8/1972 | Wachter | 249/83 |
| 3,695,573 | 10/1972 | Huffaker et al. | 249/142 |
| 4,238,107 | 12/1980 | Frankhouse | 249/83 |

Primary Examiner—Paul Lieberman
Assistant Examiner—Willie Thompson
Attorney, Agent, or Firm—C. Hercus Just

[57] ABSTRACT

A gang tool assembly for drilling a precise pattern of holes in a workpiece or otherwise cutting surfaces and the like on such workpiece and including a mounting panel of cured settable material having a pattern of holes formed therein to receive supports for powered tool heads to detachably support the same to form a gang pattern of either drills or cutters for simultaneously drilling a pattern of holes in a workpiece or forming a surface thereon. The mounting panel is formed by mounting a pattern of pins upon a base mold plate, surrounding said plate with mold sidewalls, placing sleeves upon said pins, pouring a settable slurry of high fracture strength of uniform thickness around said pins, allowing the material to cure to rigid condition, and removing the molded rigid panel and sleeves in situ therein from said base mold plate and pins to provide a rigid supporting panel for a gang of powered tool heads having supports extending through said sleeves. Detection mechanism to indicate broken drills or cutters and/or malfunctioning power heads are associated with the gang tool system.

3 Claims, 22 Drawing Figures

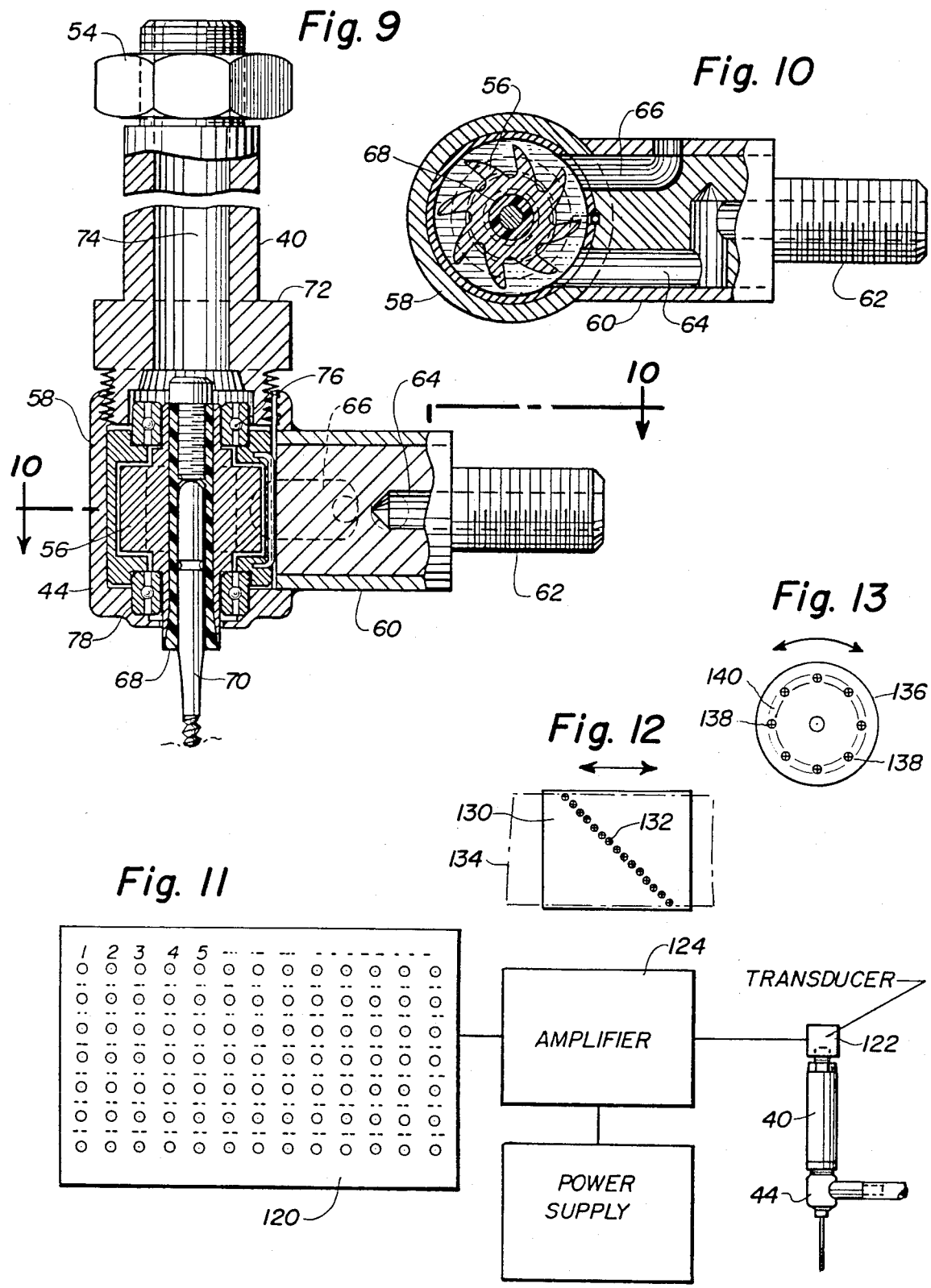

Fig. 17
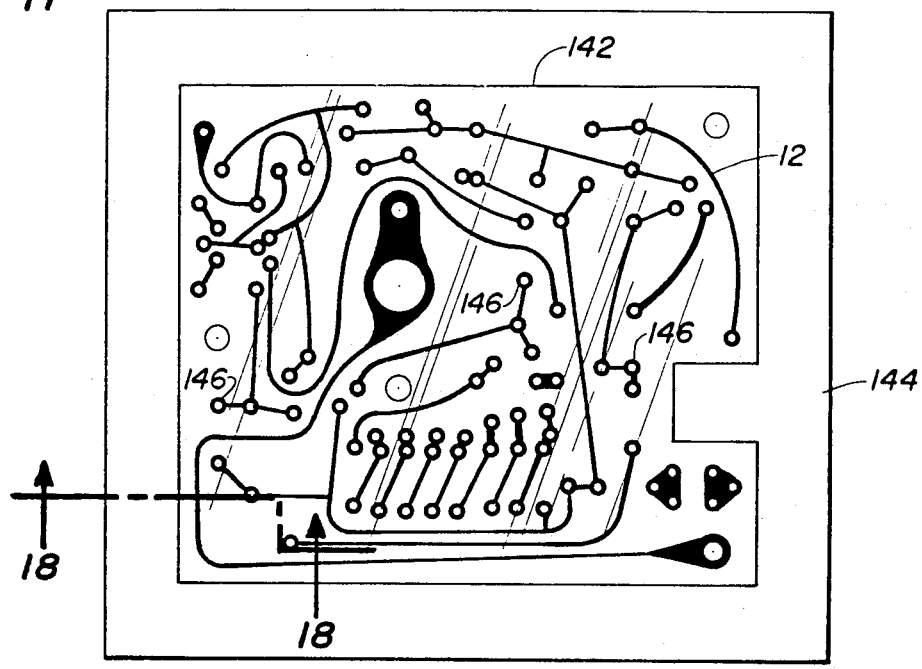
Fig. 18
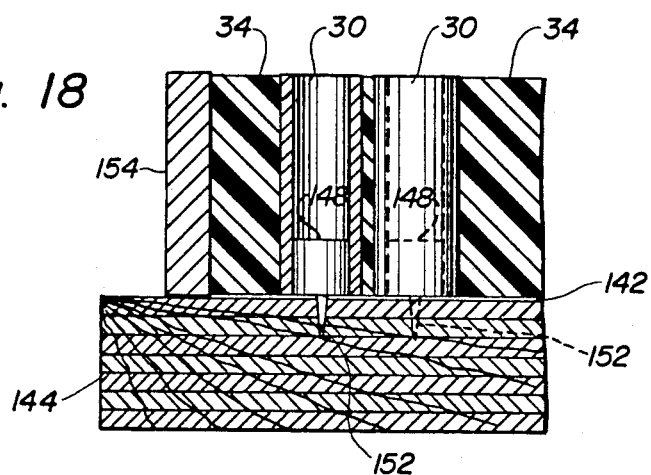
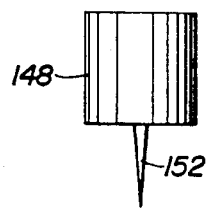
Fig. 19
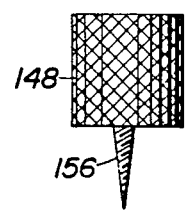
Fig. 20
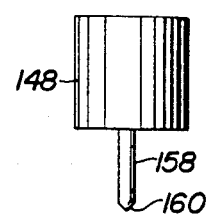
Fig. 21
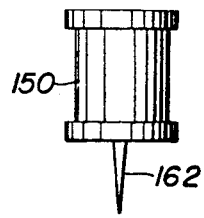
Fig. 22

GANG CUTTING TOOL ASSEMBLY AND METHOD OF FORMING SAME

This is a division, of application Ser. No. 231,341, filed Feb. 4, 1981 now abandoned.

BACKGROUND OF THE INVENTION

To a certain extent, the present invention was inspired by attempting to solve the problem of drilling multiple holes in printed circuit boards which, even in small sizes, frequently have a very substantial number of holes of varying diameters drilled in precise patterns therein for purposes of receiving connecting pins, contacts or wires on various electrical components which are integrally fixed to the printed circuit on the board by soldering. Drilling such a multiplicity of holes has heretofore been a very time-consuming operation, the crudest methods comprising individually drilling said holes by a single drill mounted either in a drill press or a numerical control or drilling machine. The close relationship of said holes renders the drilling thereof by automatic means very difficult in view of the need to simultaneously operate a plurality of drills in a precise pattern without conflict between the various drills which must be powered, and the frequent changing of drill bits to accommodate the plurality of diameters usually required.

It has been the practice in certain manufacturing operations to operate a multiplicity of drills by various power means where the close proximity of the holes drilled thereby is not as acute as found in the drilling of holes in printed circuit boards. For example, in drilling spaced holes in ladder rails for receiving the ends of the rungs of the ladder by means of a gang of drills is well-known and providing power means to operate such drills simultaneously is readily solved by gear trains, chains, or otherwise. Further, gang drilling machines which have adjustable mounts for the drills to accommodate the same to different patterns also are known, and examples of these are included among the following patents, which are typical of mechanically-operated drilling machines in which the drills are operated by gears or otherwise, as referred to above:

| U.S. Pat. No. 2,215,273 | Paradis | Sept. 17, 1940 |
| U.S. Pat. No. 3,635,570 | DeGelleke et al | Jan. 18, 1972 |
| U.S. Pat. No. 3,765,787 | Hart et al | Oct. 16, 1973 |
| U.S. Pat. No. 3,822,958 | Lewis | July 9, 1974 |
| U.S. Pat. No. 4,090,803 | Haley | May 23, 1978 |

Another problem existing in the operation of gang drills comprises detecting either malfunctioning individual drills or broken drill bits, especially when mass production is involved, and efforts have been made heretofore to provide various types of detecting means for such broken bits or malfunctioning power means, and typical examples of such devices are illustrated in the following patents:

| U.S. Pat. No. 3,025,728 | Cross et al | Mar. 20, 1962 |
| U.S. Pat. No. 3,310,796 | Sanders | Mar. 21, 1967 |
| U.S. Pat. No. 3,381,550 | Smith | May 7, 1968 |
| U.S. Pat. No. 3,627,437 | Smith | Dec. 14, 1941 |
| U.S. Pat. No. 3,669,557 | Mitchell | June 13, 1972 |
| U.S. Pat. No. 3,747,085 | Bala et al | July 17, 1973 |

Forming a support means for a multiplicity of drills also has been a problem requiring attention heretofore but especially where the proximity of the holes to be drilled isn't acute, compared to drilling of holes in printed circuit boards, it has not been particularly difficult to devise supports and mounting means for a plurality of drill shanks or chucks, but especially where drill holes are in very close proximity, as in printed circuit boards, some means for forming a support for a plurality of preferably small size power heads has given rise to the investigation of employing different materials and methods for forming such support means and investigations of suitable solutions for providing such support means comprises the subject matter of the present invention. In this, as described in greater detail hereinafter, the basic support panel is formed from a pourable and settable slurry of material having high fracture strength and in regard to investigating certain features of the invention, the most pertinent prior activities which have been found comprise prior U.S. Pat. No. 3,108,329 to Chapman, dated Oct. 29, 1963 and U.S. Pat. No. 3,290,421 to Miller, Jr., dated Dec. 6, 1966, and the distinction of the present invention over the subject matter of these patents is set forth hereinbelow.

SUMMARY OF THE INVENTION

It is among the principal objects of the present invention to provide a gang drill assembly for drilling a precise pattern of holes in a workpiece, such as a printed circuit board in which the holes may be of various diameters and very closely spaced from each other, said assembly including a mounting panel of cured settable material in which a pattern of holes are formed to receive supports for powered cutting drill heads to detachably support the same and thereby form a gang pattern of cutting drills for simultaneously drilling a pattern of holes in a workpiece.

Another object of the invention is to form said mounting panel by utilizing a base mold plate having a pattern of pins supported thereby in vertical relationship thereto, the individual pins being no closer than will permit the mounting of small diameter power heads from which supports in the form of shafts extend axially and are projected through holes formed in said mounting panel, disposing a plurality of similar sleeves respectively over said pattern of pins, pouring a settable slurry of high fracture strength of uniform thickness around said pins and within a molding compartment defined by sidewalls surrounding the base mold plate, allowing the material to cure to a rigid condition and then removing the molded rigid panel and sleeves in situ therein from said base mold plate and pins, whereby a set of related gang drill assemblies may be formed in which each assembly has a related pattern of drill heads comprising part of the overall desired pattern of holes to be drilled in a workpiece and upon the operation of each gang drill assembly of said set thereof, all holes of the overall pattern in the workpiece will have been drilled.

A further object of the invention is to provide between the operation of each gang drill assembly of said aforementioned set thereof, detecting probes or the like, arranged in a pattern identical with that of the gang drill assembly with which it is associated in operation so that by inserting said probes in the drilled holes, any holes which have not been properly drilled readily will be detected and appropriate signal means actuated to call attention to such improper drilling, such as resulting from a broken drill bit or the like.

Still another object of the invention is to provide detecting means for a malfunctioning power unit which, for example, though not restricted thereto, may respond to sound, and such detecting means individually are associated with each power head and connected in circuit with audible and/or visible indicating means to call attention to such malfunctioning of the power head.

A still further object of the invention is to provide a system whereby said set of gang drill assemblies interspersed with detecting means may be used to completely drill all required holes in a workpiece, such as described hereinabove.

Still another object of the invention is to arrange a gang drill assembly in which a pattern of drills and power heads are arranged to perform other functions than merely drilling holes, such as by operating in unison in a certain pattern to function in a planing or milling operation and/or in a circular pattern for cutting annular grooves or cutting discs from a sheet of material, and otherwise.

Details of the foregoing objects and of the invention, as well as other objects thereof, are set forth in the following specification and illustrated in the accompanying drawings comprising a part thereof.

BRIEF DESCRIPTION OF THE FIGURES

FIG. 9 is a vertical sectional view of a powered drill head embodying a fluid-operated turbine connected to a supporting shaft mounted in a sleeve of the type embedded in the settable panel shown in FIGS. 4–7.

FIG. 10 is a horizontal sectional view of the powered drill head shown in FIG. 9, as seen on the line 10—10 thereof.

FIG. 11 is a diagram showing indicating and detecting means for a malfunctioning drill head.

FIG. 12 is a fragmentary diagrammatic plan view showing a pattern of drill heads mounted for a milling or planing operation.

FIG. 13 is a diagrammatic pattern of a circular arrangement of drill heads adapted to be moved about an axis to effect a circular cut in a workpiece.

FIG. 17 is a plan view of an alternative system for locating pins upon a base plate to position sleeves to be embodied in a finished supporting panel in accordance with the invention.

FIG. 18 is a fragmentary vertical sectional view partially along the line 18—18 of FIG. 17 and illustrating details of said alternative system referred to in the description of FIG. 17.

FIGS. 19–22 are side elevations of different embodiments of positioning plugs selectively employable in the system illustrated in FIGS. 17 and 18.

DETAILED DESCRIPTION

As indicated above, development of the present invention was at least partially inspired by attempting to solve the problem of drilling holes in a printed circuit board but the invention is not to be restricted simply to this function since a multiplicity of drill heads, having cutting bits therein, and made in accordance with the present invention, has application in other functions described in detail hereinafter.

Figure 1:
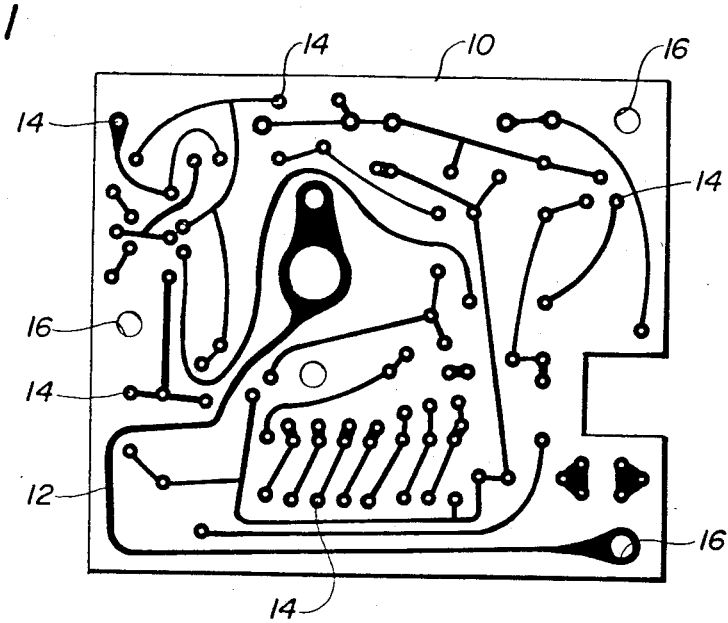
FIG. 1 is a plan view of a typical printed circuit board in which a plurality of holes are shown in elements of the circuit illustrated thereon.

Referring to FIG. 1, a typical plan view of a printed circuit board is shown in which a sheet of stiff insulating board material 10 is shown upon which a pattern of an electric circuit of "printed" metal 12 is shown in black. By processes not involved in the present invention, said metallic electric circuit is applied to the insulating board 10 and firmly adheres thereto. The board also has a multiplicity of holes 14 of small diameter drilled therein in the center of enlarged metallic areas forming an integral part of the electrical circuit and to which various wire-type leads or contacts of different types of electrical components are connected by extending through said holes and then being integrally attached to the circuit 12 by means of solder.

Figure 2:
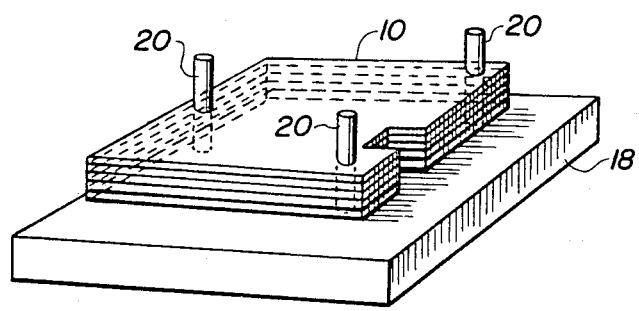
FIG. 2 is a perspective view of an exemplary set of printed circuit boards mounted upon a base plate in flatly stacked manner with respect to aligning pins.

For purposes of orienting individual circuit boards incident to drilling, for example, a limited number thereof simultaneously by means embodying the present invention, as described in detail hereinafter, each board is also provided with positioning holes 16, which are identical in each board. Referring to FIG. 2, there is illustrated therein a holding plate 18 for use in an overall machine system, described hereinafter, and utilized to support a plurality of the boards 10 in stacked relationship upon the guide and positioning pins 20, which are rigidly connected to and extend upward from the top surface of plate 18 to project through the holes 16 in the circuit boards 100.

As also referred to hereinabove, one of the principal objects of the present invention is to form a very rigid supporting panel for a plurality of drill heads and/or testing heads or the like, said panel being formed by means not previously utilized for purposes of supporting such plurality of drill heads and the like, the object of using such material being to avoid any substantial amount of preliminary drilling of holes in a supporting plate in accordance with a pattern corresponding to an operable plurality of drill heads. Therefore, according to the invention, the preferred method of forming such a panel is to utilize a pourable slurry of settable material with minimal shrinkage or expansion characteristics and capable of providing the desired strength and resistance to fracture. One form of such pourable material which has been found to be highly satisfactory comprises calcium sulphate hemihydrate. This is a form of gypsum and has the formula $CaSO_4.\frac{1}{2}H_2O$. When a mixture of such calcium sulphate hemihydrate powder is mixed with water to form a slurry, it becomes re-hydrated substantially in the form of long, needle-like crystals, which are highly suitable to provide the necessary resistance to fracture and thereby satisfy the requirements of the present invention. Notwithstanding the detailed description of the material immediately above, it is to be understood that other types of appropriate material which are capable of being formed as a slurry and then molded and permitted to set or cure may be employed, whereby the present invention is not to be restricted to the specifically recited type of gypsum material referred to above.

Figure 4:
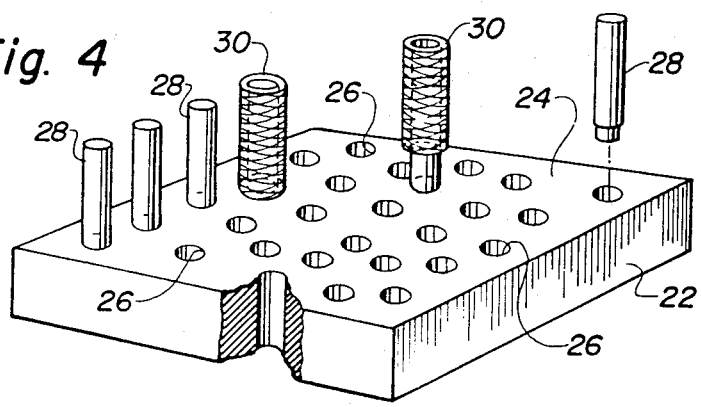
FIG. 4 is a fragmentary somewhat diagrammatic illustration showing a base plate in process of being arranged in operative manner.

The preferred procedure for forming a supporting panel in accordance with the present invention is illustrated in FIGS. 3–7, to which attention is directed, as follows:

The first several steps in the procedure are illustrated in FIG. 4 in which it will be seen that a base mold plate 22, which may be formed of metal or any other suitable material, preferably has a flat upper face 24, which serves as one of the mold surfaces. Said plate 22 is drilled with a plurality of holes 26 arranged in a specific pattern and spaced apart sufficiently to enable a plurality of powered drill heads to be supported by additional means described hereinabove without interference with each other. A plurality of pins 28, preferably of uniform size and height, are fitted into the holes 26 rigidly and are for purposes of supporting a similar pattern of sleeves 30, preferably of metal or other durable material. The outer surfaces of said sleeves are suitably roughened, such as by knurling or otherwise.

After the full complement of sleeves 30 have been mounted upon the pattern of pins 28 on base mold plate 22, said plate is surrounded with sidewalls 32 to form an enclosing mold cavity containing all of the sleeves 30, said sidewalls being of desired height dimensioned at least according to the thickness of the support plate to be formed within said mold.

Figure 5:
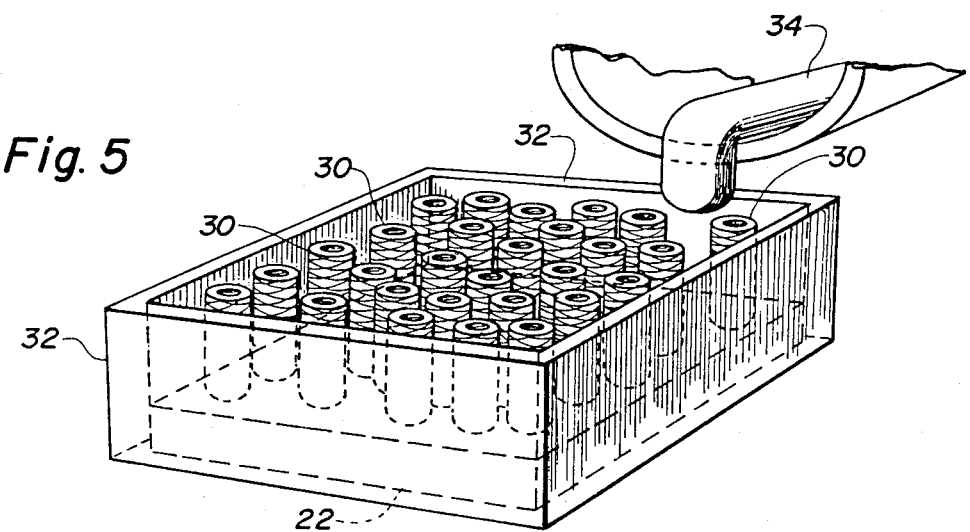
FIG. 5 is a perspective view showing a plurality of sleeves supported upon pins fixed in a predetermined pattern on a base plate surrounded by a mold into which settable material is illustrated as being poured into said mold, the container for the material being illustrated fragmentarily.
Figure 6:
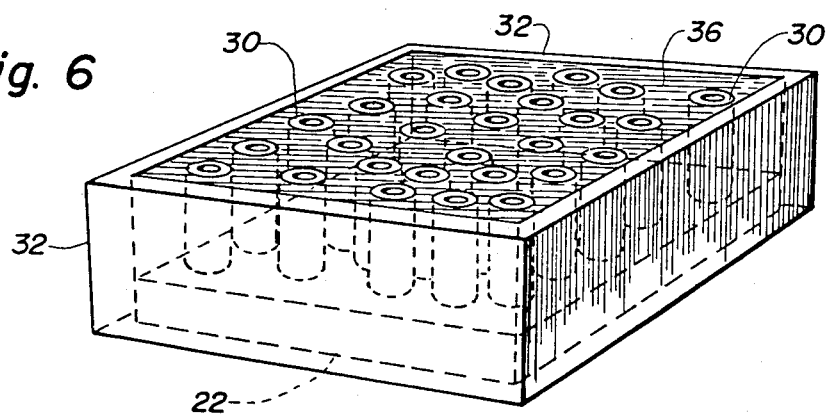
FIG. 6 is a perspective view similar to FIG. 5 but showing settable material surrounding the sleeve illustrated in FIGS. 4 and 5 and in process of being cured.
Figure 7:
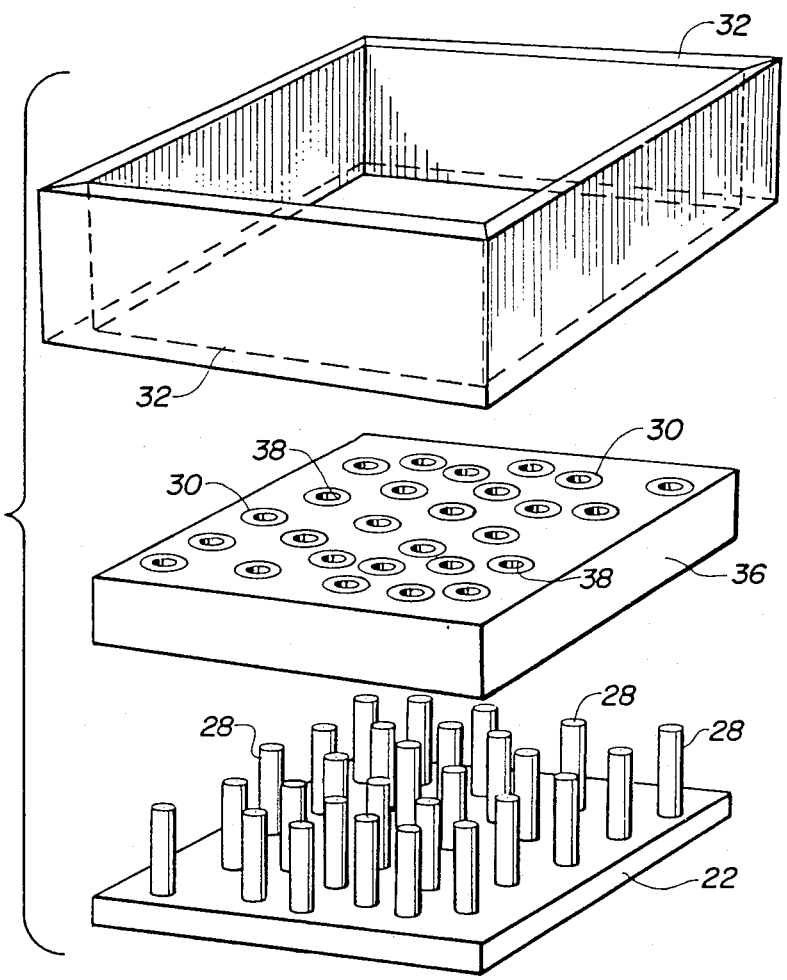
FIG. 7 is an exploded perspective view illustrating the removal of a finished panel from the base plate and pin and also separation of the confining mold from the panel.

As shown in FIG. 5, the mold is in condition to receive a pourable slurry 34 of settable material of high resistance to fracture when cured, and preferably readily settable to a very hard condition to form the mounting panel 36, shown in exemplary manner in FIG. 6 as having the upper surface thereof coextensive with the upper edges of the sidewalls 32 of the mold, and also coextensive with the upper ends of the sleeves 30. This is merely exemplary, however, and the upper surface of the panel 36 may be below the upper edges of the sidewalls 32 and the upper ends of the sleeves 30, if desired.

In any event, it is preferable that the bottom molded surface of the panel 36, adjacent the upper surface of the base mold plate 22 be planar for purposes to be described.

Figure 3:
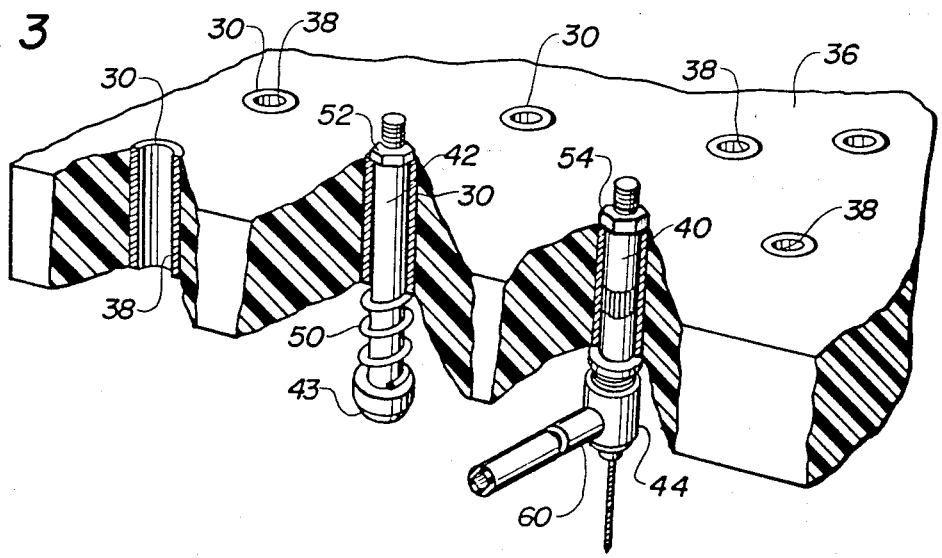
FIG. 3 is a fragmentary section of an exemplary panel of settable material made in accordance with the invention and showing respectively, in sectional manner, a mounting sleeve embedded in the panel, a pressure element reciprocably mounted within another similar sleeve, and a powered drill head supported by a shaft in still another sleeve in said panel.

Referring to FIG. 3, there is illustrated therein, three typical features of the mounting panel 36, which is shown fragmentarily and preferably is of uniform thickness of said settable material. Near the left-hand edge, there is illustrated in vertical section an exemplary sleeve 30, which is embedded, in situ, within the panel, and due to the roughened exteriors of the tubes, firm bonding thereof with the material of the panel is achieved. It, thus, will be seen that the sleeves 30 form holes 38 disposed in predetermined specific patterns for purposes of receiving supports preferably in the form of shafts 40 and 42, which are illustrated in exemplary manner in FIG. 3, respectively to show the uses employed for the holes 38 in the sleeves 30 to support certain necessary devices and instruments now described, as follows:

One of the highly important devices to be supported respectively by the shafts 40 comprise powered drill heads 44, while the shaft 42 is employed to support a pressure foot 43 which is operable to press against the top of a stack of boards 10 to aid in drill removal therefrom. The lower portion of shaft 42 is surrounded by a compression spring 50 in order that the shaft 42 may reciprocate downward in sleeve 30 in which it is mounted, within controlled limits, one of which is determined by the nut 52 threaded onto the upper end of shaft 42. In contrast, the powered drill head 44 is firmly connected to the lower end of shaft 40 and by means of another nut 54 threaded onto the upper end of shaft 40, each drill head 44 is firmly secured to the panel 36. It also is to be understood that, in accordance with the present invention, there are detecting heads 46 mounted on a separate panel 36, shown in FIG. 8, which is different from that which supports the drill heads 40 but the patterns of the holes in the respective panels in which they are mounted are the same for purposes of sequentially drilling a desired pattern of holes in a workpiece, such as the printed circuit boards 10 and immediately thereafter, checking the drilled holes to determine the completeness of said drilling or the existence of one or more broken or loose drill bits or the like, which situation is detected by the probe 48, for example.

Although other types of powered drill heads than the one specifically illustrated in FIGS. 9 and 10 may be employed to effect gang drilling of a pattern of holes in a workpiece, such as a printed circuit board, it is essential that for purposes of economy in forming a given set of gang drill assemblies and corresponding detecting assemblies, that as many drill heads as possible be mounted without conflict with each other on any individual gang drilling assembly of a set thereof. For this purpose, it is preferred that the powered drill heads be of minature nature, especially where the holes 14 in a specific pattern thereof in a circuit board 10 are arranged in very close proximity.

In view of the foregoing, the type of power head selected preferably for drilling holes in accordance with the principles of the present invention, comprises an air-driven turbine 56 of minature type, rotatably supported by anti-friction bearings within a cylindrical housing 58. For more complete details of the type of drill head which is preferred, attention is directed to prior U.S. Pat. No. 3,077,333 to Gotwald et al, dated Feb. 12, 1963. The fluid for operating the turbine is preferably air or other convenient type of gas delivered under pressure through a lateral neck 60 which terminates in a connecting nozzle 62 to which a suitable, preferably flexible, air conduit is connected and the opposite end thereof is connected to a suitable source of air under pressure, not shown.

As shown in FIG. 10, the neck 60 is provided with an air inlet port 64, which extends outwardly through the nozzle 62 and an exhaust port 66 is also formed in the neck 60 for immediate discharge of spent air from the turbine 56. The shaft of turbine 56 contains an appropriate chuck 68, which supports a cutting bit or drill 70, as clearly shown in FIG. 9.

The shafts 40 for supporting the drill heads 44 are shown in greater detail and in larger scale in FIG. 9, than otherwise shown in FIG. 3, and it will be seen that the shafts 40 otherwise are hollow and terminate at the lower end thereof in an annular shoulder 72, which abuts the lower surface of panel 36 when assemblying the required quota of drill heads upon said panel and the upper ends of the hollow tubular shafts 40 are threaded to receive the nuts 54 and thereby firmly secure the shafts 40 to the panel 36, while affording an additional air exhaust tubular opening 74 to accommodate air discharge from the vanes of the turbine 56 through the upper anti-friction bearing 76 for purposes of lubricating and cooling the same during operation. Similarly, there is clearance in the bottom wall of the housing 58 through which the lower end of the turbine shaft extends to permit the discharge of air therethrough after it has passed through the lower anti-friction bearing 78.

Figure 14:
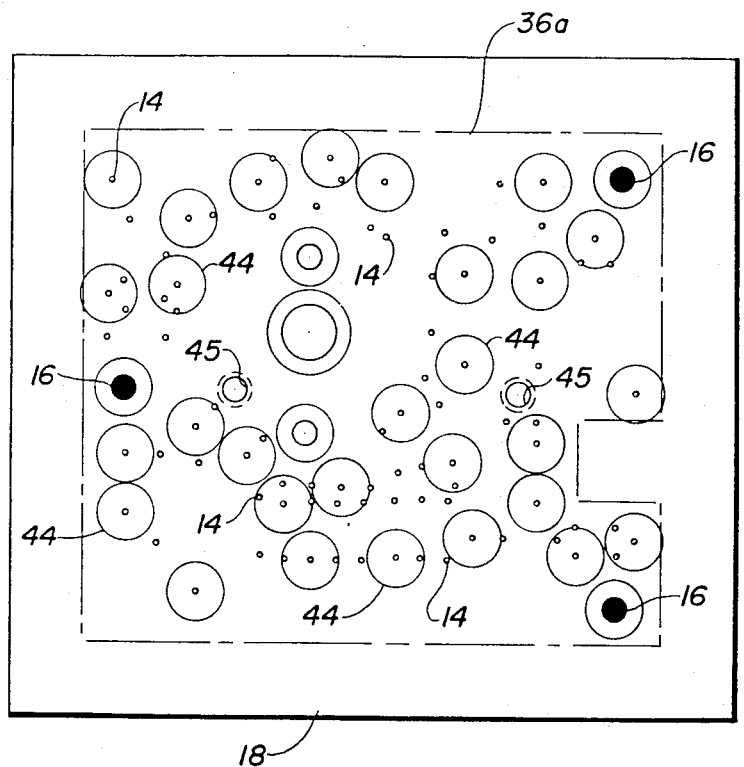
FIGS. 14 and 15 respectively show exemplary drill head patterns in a related pair of panels adapted to be successively operated upon a stack of printed circuit boards incident to completely drilling a desired pattern of holes therein.
Figure 15:
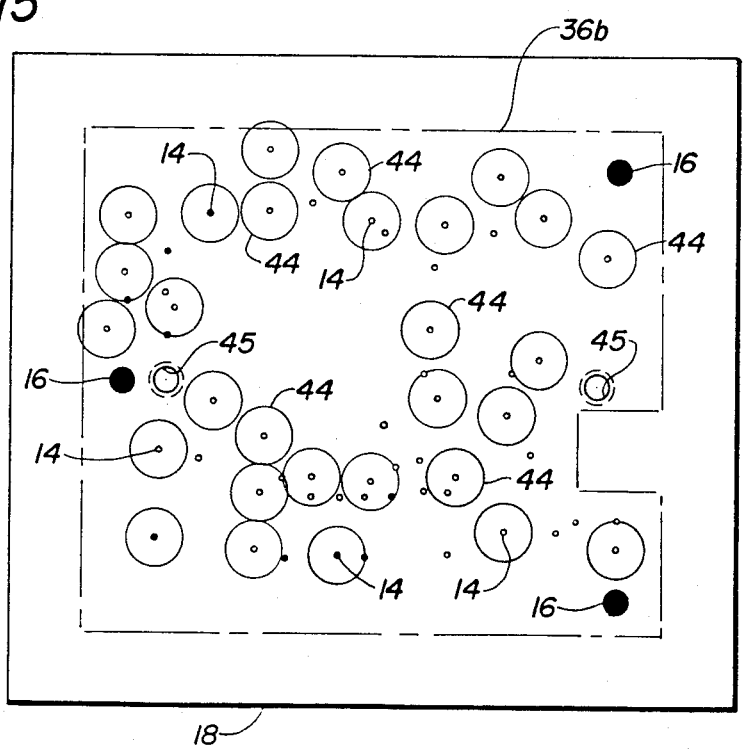

Referring to FIGS. 14 and 15, there is illustrated two exemplary different panels 36a and 36b, comprising parts of a complete set of coordinated patterns which supplement each other so that in the aggregate, after each of the panels with the pattern of powered drill heads mounted thereon have each completed drilling, for example, a limited stack of identical printed circuit boards, all of the holes in said boards will have been drilled. As shown in FIGS. 14 and 15, the exemplary pattern of holes 14 are shown in the form of tiny circles that represent most of the entire number of holes shown in the board 10 in FIG. 1. but at least show enough of the holes to illustrate the manner of arranging the sleeves 30 and the corresponding holes 38 thereof in the individual panels 36 of a set thereof, and such illustrations comprise an arrangement of the diagrammatically illustrated drill heads 44 in which none of them conflict with each other, and therefore, are capable of being mounted in individual cooperative patterns respectively in the panels of a complete set thereof. Accordingly, by orienting all of the patterns of drill heads 44 with respect to the positioning hole 16, which, in turn, also orient a stack of the printed circuit boards 10 with respect to the guide pins 22, as shown in FIG. 2, it is possible to accurately drill an entire complement of holes in a printed circuit board having a desired pattern of holes to be formed therein. Holes 45 are formed to receive attaching bolts or the like to secure supporting brackets to the mounting panels.

Another consideration to be observed is that, in view of the fact that the preferred type of powered drill heads 44 are of the air turbine type, space must be provided for connecting air or gas delivery hoses to the neck 60 of said drill head, and it can be visualized from the pattern of drill heads in FIGS. 14 and 15 that such arrangement is possible.

Figure 16:
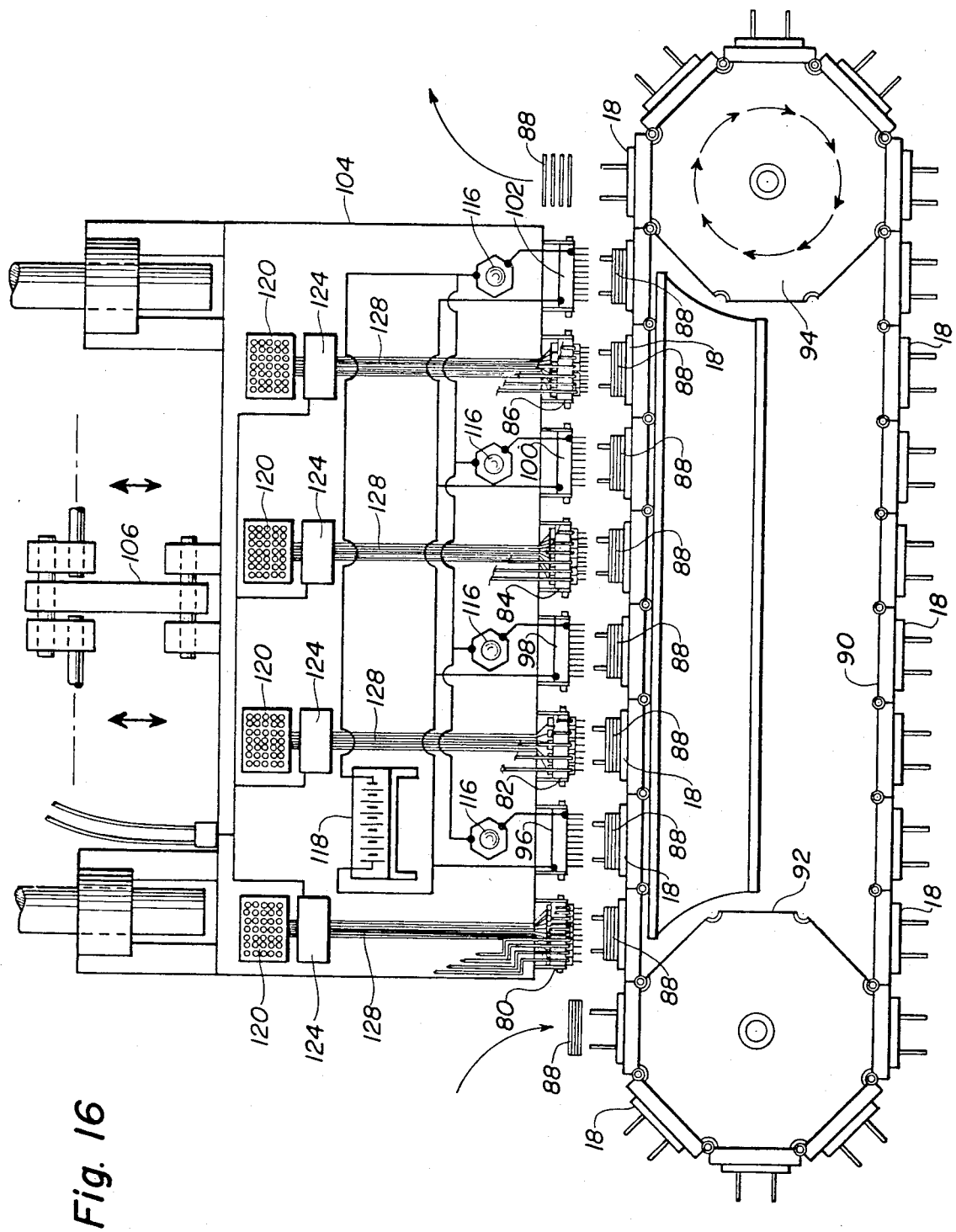
FIG. 16 is a vertical elevation showing a system for drilling holes in electronic printed circuit boards and embodying a series of successively operated gang drill assemblies, each constituting a portion of an overall pattern of holes to be drilled in sets of printed circuit boards and also including means to detect and signal incompletely drilled holes and additional means to detect and indicate malfunctioning drill heads.

Attention is now directed to FIG. 16, in which there is illustrated an exemplary machine system for utilizing each of the individual gang drill assemblies 80, 82, 84 and 86, comprising an exemplary set thereof, adequate to completely drill all of the required holes in a specific example of printed circuit boards. Said assemblies respectively comprise individual panels 36, each having a given complement of drill heads 44 mounted thereon in cooperative patterns jointly capable of providing the full complement of holes to be drilled in stacks 88 of blank printed circuit boards 10, the exemplary stack thereof nearest the left-hand end of FIG. 16 being completely undrilled. An endless conveyor 90 extends around a pair of rotatable supporting drums 92 and 94, one of which is driven by a suitable source of power, not shown, in stepwise manner, sequentially to advance the stacks 88 of the circuit board respectively to the gang drill assemblies and also to the intermediate testing head assemblies 96, 98, 100 and 102, which, like the gang drill assemblies 80–86, are commonly attached to the lower surface of a reciprocatory frame 104, clearly illustrated in FIG. 16.

The testing head assemblies 96–102 each preferably comprise a panel 36 formed in the same manner as those illustrated with respect to the gang drill assemblies 80–86. As stated, the conveyor 90 is advanced stepwise to successively introduce each of the holding plates 18, which are detachably connected accurately to each of the links of the endless flexible conveyor 90, as clearly shown in FIG. 16. By suitable control means for operating the motor which advances the conveyor 90, such as by rotation of the drum 94 in the direction of the arrows shown thereon, each of the stacks 88 of circuit boards are very accurately positioned successively for vertical reciprocation of frame 104 that carries all of the gang drill assemblies 80–86 and testing head assemblies 96–102 so that when the stacks 88 of circuit boards emerge at the right-hand end of the path traversed thereby, as shown in FIG. 16 any suitable means may be employed to remove the completely drilled stack 88 successively from the holding plates 18.

A number of commercially available, automatically controlled devices are capable of reciprocating the frame 104, one well-known commercial example of which comprises lead screws, a complement of ball nuts, a stepping motor and the like, manufactured and sold by Warner Electric Brake and Clutch Co., and capable of being operated in controlled manner for reciprocation of the frame 104 in a desired cycle of adequate vertical movements within a suitable time schedule. For example, the frame 104 may be reciprocated stepwise and successively retracted after each step, having in mind that in view of the very small diameter of holes usually employed in printed circuit boards, the drills employed to form such holes are highly susceptible to breakage if applied in drilling manner to a workpiece for any sustained period of time. Therefore, by reciprocating each gang drill assembly in successive steps in which each step drills, for example, only a single circuit board, it can be seen that if a stack of four circuit boards are to be drilled, four reciprocations of the drill assembly is made, each step descending an additional amount equivalent to the thickness of a circuit board, until all of the circuit boards have been drilled.

In FIG. 16, exemplary actuating means 106 is illustrated to symbolize suitable means to reciprocate the frame 104, either of the exemplary type described above, or any other actuating mechanism, which preferably will provide a step-type reciprocation for purposes of minimizing breakage of drill or milling bits, said reciprocation being indicated by suitable arrows in the upper portion of FIG. 16.

TESTING MECHANISM

Figure 8:
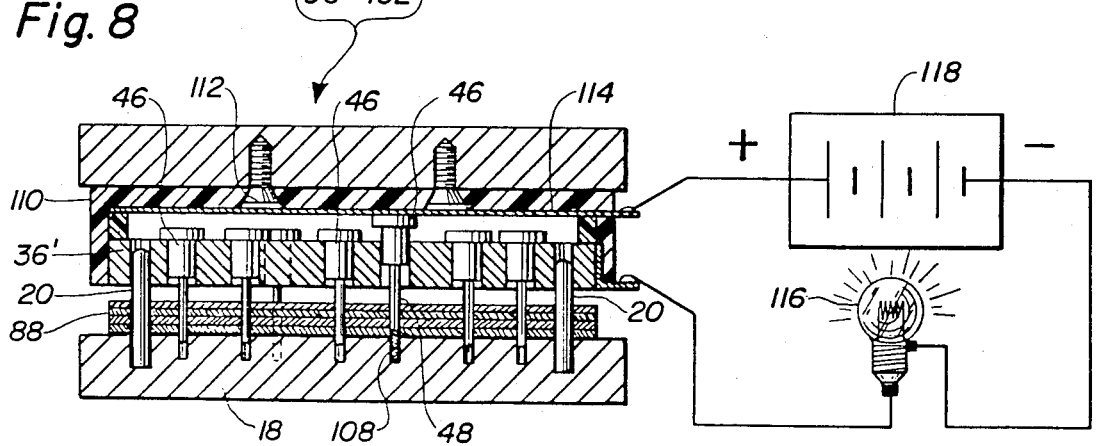
FIG. 8 is a vertical sectional view of indicating mechanism for detecting improperly drilled holes in a stack of printed circuit boards, and also showing exemplary indicating means.

Especially in view of the fact that drilling holes of a small diameter in workpieces, such as printed circuit boards or otherwise, involves the use of small diameter drill bits, breakage of the same is not uncommon. The stepwise reciprocation thereof referred to above tends to minimize such breakage. However, especially in mass production of drilled printed circuit boards, such as contemplated for production by the exemplary equipment and system illustrated in FIG. 16, it is preferred and actually is essential that testing of the drilled workpieces be performed in a manner automatically to indicate the existence of incompletely drilled holes, for example, which usually will indicate the existence of a broken drill bit, whereupon the operation of the machine may be stopped and the broken bit can be replaced, after which operation of the machine is continued. One exemplary form of testing equipment for use with a stack of workpieces, such as printed circuit boards, comprises support shafts 42, of which one exemplary illustration is included in FIG. 3, said shafts being mounted for limited reciprocation of detecting heads 46, each supporting a probe 48, for example, of an appropriate diameter to easily descend within holes drilled in the stacks 88 of circuit boards 10. Referring to FIG. 8, there is illustrated therein a vertically sectioned assembly, showing a holding plate 18 upon which a stack 88 of drilled circuit boards is supported in conjunction with one of the testing head assemblies 96–102. The mounting panel 36 supports a modified version of the support shaft 42, shown in FIG. 3, in the formation of a plurality of detecting heads 46, arranged in a pattern in mounting panel 36, which is identical with a corresponding pattern of drill heads immediately upstream from the exemplary testing head assembly 96–102, shown in FIG. 8.

An exemplary drill bit fragment 108 is illustrated in one of the holes drilled in the stack 88 of circuit boards, said fragment being disposed in one of the shallow holes provided in the holding plate 18, in order that the drill bits 70 may drill entirely through the stack 88. The fragment 108 extends up into at least the lowermost circuit board in the stack 88, by way of example, whereby when the probe 48 engages the fragment 108, it will raise the detecting head 46, as illustrated in exemplary manner in FIG. 8. Preferably, the detecting heads 46 are metallic and the mounting panel 36' also is metallic in the modified embodiment shown in FIG. 8, as distinguished from the exemplary showing of detecting head 46 in FIG. 3. Mounting panel 36' is insulated from the testing head assemblies 96–102 by an electrical insulating frame 110, which supports the mounting panel 36' and is secured to said testing head assemblies by any suitable means, such as screws 112. A metallic contact sheet 114 extends along the lower interior surface of insulating frame 110. Exemplary indicating means in the form of an electric lamp bulb 116 is supported in circuit with an exemplary electrical source 118, said circuit also respectively being connected in series with contact sheet 114 and the metallic mounting panel 36' is illustrated adjacent the right-hand end of the illustration shown in FIG. 8. When the displaced detecting head 46 engages the contact sheet 114, the bulb 116 will be lighted to constitute a signal that a broken drill bit exists.

If desired, a more elaborate detecting system may be provided, as explained hereinafter, so that in addition to merely indicating the existence of a broken drill bit, the location of such drill bit in the pattern thereof, also may be indicated.

Referring to FIG. 11, there is illustrated therein a signal board 120, which includes a plurality of minute signal lights associated with numerical indicia to indicate the location of a malfunctioning drill head 44, one of which is shown in FIG. 11, supported on the lower end of its mounting shaft 40, which, it will be understood, is supported in one of the mounting panels 36. A sound-responsive transducer 122, such as the type used in phonograph pickup heads, is mounted on the upper end of each of the shafts 40, so as to be responsive to sound generated by the drill head 44. When, for example, the bearing 76 or 78 of one of the air turbine-type drill heads becomes worn beyond a desirable limit, a modified sound will be produced by such a drill head and the transducer 122 is of the type which will be responsive to such modified sound and transmit the same to an amplifier 124, which is connected in circuit with a power supply 126, for purposes of transmitting current to an individual signal light in the signal board 120, corresponding to the malfunctioning drill head 44, it being understood that there is a circuit between each transducer and its corresponding signal light in the signal board 120. A cluster 128 of conducting wires, illustrated in exemplary manner in FIG. 16, extends between the drill heads 44 of each gang drill assembly 80–86, and the respective signal lights therefor in the signal board 120, thereby visually and quickly indicating the existence of a malfunctioning drill head in order that service personnel may replace the same.

Referring to FIGS. 12 and 13, additional types of operation embodying patterns of powered drill heads are illustrated therein. For example, in FIG. 12, by providing a head 130, supported by suitable mechanism, such as a milling machine or the like, it is possible to mount a diagonal row 132 of drill heads 44 thereon, and move the head 130 either in one direction or reciprocate the same in opposite directions, as indicated by the arrow shown in said figure. For purposes of having cutting bits, such as end mills, rotated by said row of drill heads to effect a planing operation upon a flat workpiece 134, for example, it will be understood that the row 132 of drill heads can be at such an angle with respect to the direction of movement of the head 130 that the cutting ends of all of the end mills will be in a common plane and will supplement each other to make a complete cut across the width of the workpiece 134, for example.

As shown in FIG. 13, a circular head 136 may be provided with a circular pattern of drill heads to support a plurality of end mills 138, for example, the cutting ends of which are all disposed in a common plane, and by rotating the heads 136, either in a single direction or reciprocating the same in opposite circular directions, the end mills are capable of cutting either a circular groove 140, shown in dotted lines in FIG. 13, or particularly in working with sheet material, such arrangement may be employed to cut holes in or discs from a workpiece. Therefore, the exemplary illustrations in FIGS. 12 and 13 serve to illustrate the versatility of such an arrangement of drill heads preferably supported by mounting heads and the like, illustrated in exemplary manner in FIGS. 12 and 13, to perform operations other than merely drilling holes in workpieces and in which, preferably, the supporting heads are formed in a manner described above with respect to forming the mounting panels 36 for operation with the exemplary machine system illustrated in FIG. 16.

ADDITIONAL EMBODIMENT OF MOLD-FORMING MEANS

An additional or alternative manner of forming a suitable mold for making a mounting panel of hard and cured settable material is illustrated in FIGS. 17-22. Such alternative means comprises selecting a base plate of an area greater than a sheet upon which is printed or photographed a pattern of holes to be produced in the finished mounting panel. This sheet may be a drawing of a printed electrical circuit in which drilled holes are to be included. The holes, for example, may be illustrated as circles. An exemplary type of pattern of a printed circuit is illustrated in FIG. 17 in which the pattern 12, as in the preceding embodiments, is produced upon a sheet of paper or photograph 142. The sheet 142 is superimposed upon one surface of a base plate 144, which preferably is of non-metallic material and sufficiently yieldable to be susceptible to being penetrated by sharp objects. Plywood is one excellent example of this type of material but other forms of wood, bonded fiber material of which one type is sold under the trademark "Cellotex", or any other type of building material or the like, having such characteristics may be used.

Referring to FIG. 18, a fragmentary vertical elevation of a section or portion of the base plate 144, shown in FIG. 17, is illustrated in exemplary manner on a larger scale than employed in FIG. 17. The paper sheet or photograph 142 is shown superimposed upon the upper surface of the base plate 144 in FIG. 18.

Referring to FIG. 17, the electrical circuit pattern 12 includes a plurality of small circular configurations 146, representing holes into which certain contacts or components of electrical elements are to be inserted in the finished printed circuit board and assembly. In accordance with this additional embodiment, it is contemplated that a plurality of plug-like members 148 made of metal, plastic material, or any other appropriate substance, are illustrated in various types respectively in FIGS. 19-22. In FIG. 22, the plug-like member 150 is different in shape and contour from the members 148, shown respectively in FIGS. 19-21, for purposes described hereinafter.

The plug-like members 148 and 150 each have an appendage extending axially from one end thereof. The various embodiments shown in FIGS. 19-22 have appendages of alternate types in which, in FIG. 19, the appendage 152 preferably is a relatively slim needle-like member somewhat resembling a phonograph needle and is readily capable of penetrating through a selected circular configuration 146 of the printed circuit pattern 12, said appendage then, by application of reasonable force, penetrating the base plate 144, which is of a yieldable nature, as described above. Such penetration preferably is for the full extent of the appendage 152 in order to firmly position the plug-like member 148 upon the upper surface of the base plate 144 and firmly abutting the paper sheet or photograph 142.

It will be understood that in accordance with the foregoing description, especially pertaining to FIGS. 14 and 15, which are of exemplary nature, that a plurality of the plugs 148 will be applied to the pattern sheet 142 and base plate 144 by impinging the same through the circular configurations 146 in such manner that the plugs do not interfere with each other and there is sufficient space between adjacent plugs that said plugs are capable of receiving, preferably in closely slidable manner, the sleeves 30, which, for example, are the same as the sleeves 30 illustrated in the preceding embodiment. Said sleeves are slipped upon the plug-like members 148 until one end thereof abuts the sheet 142, and if the plug-like members 148 have been firmly applied to the sheet 142 and base plate 144, the sleeves 30 will be perpendicular to the base plate 144.

After a full complement of one selected pattern of plug-like members 148 and sleeves 30 have been affixed to a single base plate 144, without interference between the sleeves 30 thereon, interconnected side mold members 154 are placed upon the sheet 142 in a manner to circumscribe all of the sleeves 30 mounted upon the base plate 144, it being understood that the sides 154 are of a polygonal nature, usually the square or rectangular, and one edge of the side mold members 154 firmly abut the sheet 142. The height of the side mold members 154 preferably is at least equal to the length of the sleeves 30, as illustrated in exemplary manner in FIG. 18.

After the foregoing assembly has been made, it constitutes a mold into which a slurry of pourable, settable material 34, similar to that described in regard to the preceding embodiments, is poured into the aforementioned mold to a desired uniform height, usually substantially equal to the height of the side mold members 154 and the sleeves 30. After the material 34 has set and cured a desired amount, the side mold members 154 are removed from the molded mounting panel thus formed and in which the sleeves 30 are integrally bonded. The molded mounting panel then is lifted from the base plate 144 and sheet 142, incidentally pulling the sleeves away from the plug-like members 148, which have positioned the sleeves within the mold comprising the side members 154.

Various embodiments of plug-like members are illustrated in FIGS. 19-22, as referred to above. In the embodiment shown in FIG. 20, the appendage 156 on the plug-like member 148 preferably is in the form of a somewhat slimly-tapered screw thread of the type similar to those formed on wood screws for purposes of rendering the appendage capable of easy insertion into the base plate 144, especially when the base plate is formed of plywood, certain types of which are very hard and resist penetration.

In FIG. 21, still another embodiment of plug-like member 148 is shown in which the appendage 158 is cylindrical in nature but terminates in a tapered point 160 and is usable, for example, where holes of small diameter are first drilled into the base plate 144, and into which holes the appendage 158 fits snuggly.

Lastly, FIG. 22 shows plug-like member 150 having an appendage 162 similar to appendage 152, for example, but the opposite end portions of plug-like member 150 provide separate surfaces to engage the interior of the sleeve 30, especially if the member 150 is longer than the other members in FIGS. 19-21, to provide stability to the sleeve 30.

The foregoing description illustrates preferred embodiments of the invention. However, concepts employed may, based upon such description, be employed in other embodiments without departing from the scope of the invention. Accordingly, the following claims are intended to protect the invention broadly, as well as in the specific forms shown herein.

We claim:

1. Means for forming a rigid mounting panel of settable material having an irregular pattern of holes comprising one of a set of related patterns and including sleeves integrally embedded in said material to receive and support respectively a plurality of tool-supporting heads adapted to drill a partial irregular pattern of holes in a workpiece requiring an overall irregular pattern of holes, said means comprising in combination:

(a) a diagram sheet indicating said irregular pattern of holes thereon,
   (b) a base plate of non-metallic material capable of being penetrated by sharp appendages and having an area at least as large as said diagram sheet and upon which said sheet is mounted upon one surface thereof,
   (c) interconnected side mold members positioned edgewise upon said base plate to form a polygon which circumscribes said irregular pattern of holes upon said diagram sheet,
   (d) a plurality of plug-like members of uniform diameter having an axially-extending appendage on one end of each member adapted to penetrate said base plate at the center of the indication of each hole on said diagram sheet for firm support by said plate, said members having a size corresponding to objects to be attached to said mounting panel without interference with adjacent objects,
   (e) a plurality of similar cylindrical sleeves of uniform length and diameter, the inner diameter of said sleeves being complementary to the outer diameter of said plug-like members and slidably disposed thereon for perpendicular support of said sleeves upon said base plate, thereby forming a mold within which a slurry of said settable material may be poured to a desired depth relative to the height of said sleeves and surrounding the same for fixation of the same in situ in said material when the same has set in cured condition, whereby a rigid mounting panel is formed having an irregular pattern comprising one of a set of related patterns which constitute means to drill an overall irregular pattern of lined holes adapted to receive shanks of similar tool-supporting heads.

2. The panel-forming means according to claim 1 in which said base plate is of a wood nature and said appendages at least have sharpened points.

3. The panel-forming means according to claim 2 in which said appendage is provided with screw threads.

* * * * *